United States Patent
Chen

(10) Patent No.: US 12,495,712 B2
(45) Date of Patent: Dec. 9, 2025

(54) METHOD OF PROCESSING PHOTORESIST LAYER, METHOD OF MANUFACTURING DISPLAY PANEL, AND DISPLAY PANEL

(71) Applicant: Shenzhen China Star Optoelectronics Semiconductor Display Technology Co., Ltd., Shenzhen (CN)

(72) Inventor: Jianrong Chen, Shenzhen (CN)

(73) Assignee: SHENZHEN CHINA STAR OPTOELECTRONICS SEMICONDUCTOR DISPLAY TECHNOLOGY CO., LTD., Guangdong (CN)

(*) Notice: Subject to any disclaimer, the term of this patent is extended or adjusted under 35 U.S.C. 154(b) by 0 days.

(21) Appl. No.: 17/618,853

(22) PCT Filed: Nov. 23, 2021

(86) PCT No.: PCT/CN2021/132308
§ 371 (c)(1),
(2) Date: Dec. 13, 2021

(87) PCT Pub. No.: WO2023/082323
PCT Pub. Date: May 19, 2023

(65) Prior Publication Data
US 2024/0065086 A1 Feb. 22, 2024

(30) Foreign Application Priority Data
Nov. 15, 2021 (CN) .......................... 202111350222.2

(51) Int. Cl.
*H10K 71/00* (2023.01)
*H10K 59/122* (2023.01)
(Continued)

(52) U.S. Cl.
CPC ......... *H10K 71/621* (2023.02); *H10K 59/122* (2023.02); *H10K 59/80522* (2023.02); *H10K 71/40* (2023.02)

(58) Field of Classification Search
None
See application file for complete search history.

(56) References Cited

U.S. PATENT DOCUMENTS

| 2002/0090577 A1* | 7/2002 | Asanuma | G03F 7/203 430/326 |
| 2006/0204903 A1* | 9/2006 | Choi | H10K 71/40 430/328 |

(Continued)

FOREIGN PATENT DOCUMENTS

| CN | 103928497 A | 7/2014 | |
| CN | 106058079 A * | 10/2016 | ......... H01L 27/3246 |

(Continued)

OTHER PUBLICATIONS

International Search Report in International application No. PCT/CN2021/132308, mailed on Jul. 27, 2022.

(Continued)

*Primary Examiner* — Sue A Purvis
*Assistant Examiner* — Seyon Ali-Simah Punchbeddell
(74) *Attorney, Agent, or Firm* — PV IP PC; Christopher S. Ruprecht; Wei Te Chung

(57) ABSTRACT

Embodiments of the present application disclose a method of processing a photoresist layer, a method of manufacturing a display panel, and a display panel. By performing two exposure processes and one development process on a negative photoresist layer, an undercut structure can be obtained, effectively simplifying a process of manufacturing the undercut structure, thereby improving the production efficiency.

10 Claims, 11 Drawing Sheets

(51) Int. Cl.
*H10K 59/80* (2023.01)
*H10K 71/40* (2023.01)

(56) References Cited

U.S. PATENT DOCUMENTS

| | | | |
|---|---|---|---|
| 2019/0094698 A1* | 3/2019 | Carcasi | G03F 7/2022 |
| 2019/0229152 A1* | 7/2019 | Wang | H10K 59/122 |
| 2020/0409272 A1* | 12/2020 | Sharma | G03F 7/70608 |
| 2022/0037148 A1* | 2/2022 | Zhang | H01L 21/31144 |
| 2022/0077258 A1* | 3/2022 | Jung | H10K 50/814 |
| 2022/0173179 A1* | 6/2022 | Lee | H10K 59/122 |

FOREIGN PATENT DOCUMENTS

| | | |
|---|---|---|
| CN | 107403823 A | 11/2017 |
| CN | 107703722 A | 2/2018 |
| CN | 109103349 A | 12/2018 |
| CN | 110911461 A | 3/2020 |
| CN | 111370451 A | 7/2020 |
| JP | 2008305882 A | 12/2008 |
| KR | 20210023720 A * | 3/2021 |

OTHER PUBLICATIONS

Written Opinion of the International Search Authority in International application No. PCT/CN2021/132308, mailed on Jul. 27, 2022.

Chinese Office Action issued in corresponding Chinese Patent Application No. 202111350222.2 dated Sep. 19, 2022, pp. 1-6.

* cited by examiner forming a first pixel definition layer on a substrate, wherein the first pixel definition layer is a negative photoresist layer, the substrate is provided with an auxiliary electrode and a first electrode spaced apart from each other; the first pixel definition layer is defined with a dam area, an opening area, a via hole area, and a first undercut area; the dam area encloses the opening area, the dam area and the first undercut area enclose the via hole area; the via hole area is defined corresponding to the auxiliary electrode; and the opening area is defined corresponding to the first electrode; — Step B 10 performing a first exposure process on the dam area and the first undercut area of a first pixel definition layer; — Step B 20 performing a second exposure process on a second undercut area of the first pixel definition layer, wherein one side of the second undercut area extends to the first undercut area, another side of the second undercut area is connected to the via hole area, and an exposure amount of the first exposure process is greater than an exposure amount of the second exposure process; — Step B 30 performing a development process on the first pixel definition layer to remove the first pixel definition layer in the opening area and the via hole area, to form a pixel opening exposing the first electrode and a connection via hole exposing the auxiliary electrode; — Step B 40 thermally curing a remaining portion of the first pixel definition layer, wherein the first pixel definition layer corresponding to the first undercut area and the second undercut area forms an undercut structure, the first pixel definition layer corresponding to the dam area forms a dam, the dam is enclosed to form the pixel opening for exposing the first electrode, and the dam and the undercut structure are enclosed to form the connection via hole for exposing the auxiliary electrode; — Step B50 forming a light-emitting layer on the first electrode — Step B 60 forming a second electrode on the light-emitting layer, wherein the second electrode extends into the connection via hole and is connected to the auxiliary electrode; — Step B 70 forming an encapsulation layer on the second electrode, wherein the encapsulation layer covers the dam and the undercut structure. — Step B 80

FIG. 11

METHOD OF PROCESSING PHOTORESIST LAYER, METHOD OF MANUFACTURING DISPLAY PANEL, AND DISPLAY PANEL

CROSS-REFERENCE TO RELATED APPLICATION

This application is a national phase application under 35 U.S.C. § 371 of PCT/CN2021/132308 filed Nov. 23, 2021, which claims priority to Chinese Application No. 202111350222.2 filed Nov. 15, 2021, the contents of which are incorporated herein by reference in their entirety.

BACKGROUND OF INVENTION

Field of Invention

The present application relates to a field of display, in particular to a method of processing a photoresist layer, a method of manufacturing a display panel, and a display panel.

Description of Prior Art

A self-luminous organic light-emitting diode display (OLED) has advantages of fast response time, high contrast, wide viewing angles, etc., and is easy to realize flexible display, so it is widely used. OLED displays are very likely to become the mainstream products of a next generation of display technology. The OLED display panel structure includes a transparent anode layer, a light-emitting layer, and a metal cathode layer. In order to increase transmittance of top emission, a thickness of the metal cathode is relatively thin, resulting in a large square resistance and a serious current drop (IR drop), which leads to obvious uneven brightness of the display panel, and seriously impacts display effect of the OLED display device. In order to improve the uneven brightness of the display panel, an auxiliary electrode layer can be configured and connected to a thinner metal cathode. Since a resistance of the auxiliary electrode layer is small, a current voltage drop is reduced, and when applying a power, an impedance of a cathode of the panel and the current voltage drop are reduced, and brightness uniformity is improved to a certain extent.

Regarding how to realize connection between the auxiliary electrode layer and the metal cathode, an undercut structure is usually set between the cathode and the auxiliary electrode layer. The undercut structure usually needs to be made through two lithography processes (exposure and development), and its manufacturing process is complicated, thus reducing production efficiency.

Embodiments of the present application provide a method of processing a photoresist layer, a method of manufacturing a display panel, and a display panel, which can solve the technical problems of complicated manufacturing process and low production efficiency of an undercut structure.

SUMMARY OF INVENTION

An embodiment of the present application provides a method of processing a photoresist layer, including:
Step B1, forming a negative photoresist layer;
Step B2, performing a first exposure process on a first exposure area of the negative photoresist layer;
Step B3, performing a second exposure process on a second exposure area of the negative photoresist layer, wherein the second exposure area has at least a portion defined at a side of the first exposure area and connected to the first exposure area, and an exposure amount of the first exposure process is greater than an exposure amount of the second exposure process;
Step B4, performing a development process on the negative photoresist layer to remove a portion of the negative photoresist layer that has not undergone photoreaction; and
Step B5, thermally curing a remaining portion of the negative photoresist layer to obtain an undercut structure.

Optionally, in some embodiments of the present application, the first exposure area is defined in the second exposure area, and an area of the second exposure area is larger than an area of the first exposure area.

Optionally, in some embodiments of the present application, the first exposure area and the second exposure area partially overlap.

Optionally, in some embodiments of the present application, the second exposure area is defined on a side surface of the first exposure area and connected to the first exposure area.

Optionally, in some embodiments of the present application, an exposure time of the first exposure process is greater than an exposure time of the second exposure process.

Optionally, in some embodiments of the present application, the step B2 further including performing the first exposure process on a third exposure area of the negative photoresist layer, the first exposure area and the third exposure area are spaced apart from each other, and the second exposure area and the third exposure area are spaced apart from each other; and
in the step B5, portions of the negative photoresist layer corresponding to the first exposure area and the second exposure area form the undercut structure, and another portion of the negative photoresist layer corresponding to the third exposure are forms a mesa structure.

Optionally, in some embodiments of the present application, the undercut structure has a negative slope angle, and the mesa structure has a positive slope angle.

Another embodiment of the present application also provides a method of manufacturing a display panel, including:
Step B10, forming a first pixel definition layer on a substrate, wherein the first pixel definition layer is a negative photoresist layer, the substrate is provided with an auxiliary electrode and a first electrode spaced apart from each other; the first pixel definition layer is defined with a dam area, an opening area, a via hole area, and a first undercut area; the dam area encloses the opening area; the dam area and the first undercut area enclose the via hole area; the via hole area is defined corresponding to the auxiliary electrode; and the opening area is defined corresponding to the first electrode;
Step B20, performing a first exposure process on the dam area and the first undercut area of a first pixel definition layer;
Step B30, performing a second exposure process on a second undercut area of the first pixel definition layer, wherein one side of the second undercut area extends to the first undercut area, another side of the second undercut area is connected to the via hole area, and an exposure amount of the first exposure process is greater than an exposure amount of the second exposure process;
Step B40, performing a development process on the first pixel definition layer to remove the first pixel definition layer in the opening area and the via hole area, to form a pixel opening exposing the first electrode and a connection via hole exposing the auxiliary electrode;

Step B50, thermally curing a remaining portion of the first pixel definition layer, wherein the first pixel definition layer corresponding to the first undercut area and the second undercut area forms an undercut structure, the first pixel definition layer corresponding to the dam area forms a dam, the dam is enclosed to form the pixel opening for exposing the first electrode, and the dam and the undercut structure are enclosed to form the connection via hole for exposing the auxiliary electrode;

Step B60, forming a light-emitting layer on the first electrode; and

Step B70: forming a second electrode on the light-emitting layer, wherein the second electrode extends into the connection via hole and is connected to the auxiliary electrode.

Optionally, in some embodiments of the present application, the first undercut area is defined in the second undercut area, and an area of the second undercut area is larger than an area of the first undercut area.

Optionally, in some embodiments of the present application, the first undercut area and the second undercut area partially overlap.

Optionally, in some embodiments of the present application, the second undercut area is defined at one side of the first undercut area, and the second undercut area is connected to the first undercut area.

Optionally, in some embodiments of the present application, the exposure amount of the first exposure process ranges from 40 mJ/cm² to 60 mJ/cm².

Optionally, in some embodiments of the present application, the exposure amount of the second exposure process ranges from 10 mJ/cm² to 30 mJ/cm².

Optionally, in some embodiments of the present application, an exposure time of the first exposure process is greater than an exposure time of the second exposure process.

Optionally, in some embodiments of the present application, the undercut structure has a negative slope angle, and the dam has a positive slope angle.

Optionally, in some embodiments of the present application, the substrate further includes a base substrate and a driving circuit layer disposed on the base substrate, the auxiliary electrode and the first electrode are disposed on the driving circuit layer, and the first electrode is electrically connected to the driving circuit layer.

Optionally, in some embodiments of the present application, the substrate further includes a second pixel definition layer disposed on the auxiliary electrode and the first electrode, the first pixel definition layer is disposed on the second pixel defining layer, and the second pixel definition layer is defined with a first through hole for exposing the auxiliary electrode and a second through hole for exposing the first electrode.

Optionally, in some embodiments of the present application, the substrate further includes a base substrate and a driving circuit layer disposed on the base substrate, the auxiliary electrode and the first electrode are disposed on the driving circuit layer, and the first electrode is electrically connected to the driving circuit layer.

Optionally, in some embodiments of the present application, the method of manufacturing the display panel further includes:

Step 80, forming an encapsulation layer on the second electrode and covering the dam and the undercut structure.

Further another embodiment of the present application also provides a display panel, including:

a base substrate;

a driving circuit layer disposed on the base substrate;

an auxiliary electrode disposed on the driving circuit layer;

a first electrode disposed on the driving circuit layer and spaced apart from the auxiliary electrode;

a dam disposed on the driving circuit layer, wherein the dam is made of a negative photoresist, the dam has a positive slope angle, the dam is enclosed to form a pixel opening, and the pixel opening exposes the first electrode;

an undercut structure disposed on the drive circuit layer, wherein the undercut structure is made of a negative photoresist, the undercut structure has a negative slope angle, the undercut structure and the dam are enclosed to form a connection via hole, the connection via hole exposes the auxiliary electrode;

a light-emitting layer disposed on the first electrode; and a second electrode disposed on the light-emitting layer, wherein the second electrode extends into the connection via hole and is connected to the auxiliary electrode.

Embodiments of the present application adopts a method of processing a photoresist layer, a method of manufacturing a display panel, and a display panel. By performing two exposure processes and one development process on a negative photoresist layer, an undercut structure can be obtained, effectively simplifying a process of manufacturing the undercut structure, thereby improving the production efficiency.

BRIEF DESCRIPTION OF DRAWINGS

In order to more clearly illustrate the technical solutions of the embodiments of the application, the drawings illustrating the embodiments will be briefly described below. Obviously, the drawings in the following description merely illustrate some embodiments of the present invention. Other drawings may also be obtained by those skilled in the art according to these figures without paying creative work.

FIG. 11 is a schematic flowchart of a method of manufacturing a display panel provided by an embodiment of the present application.

DETAILED DESCRIPTION OF PREFERRED EMBODIMENTS

Figure 1:
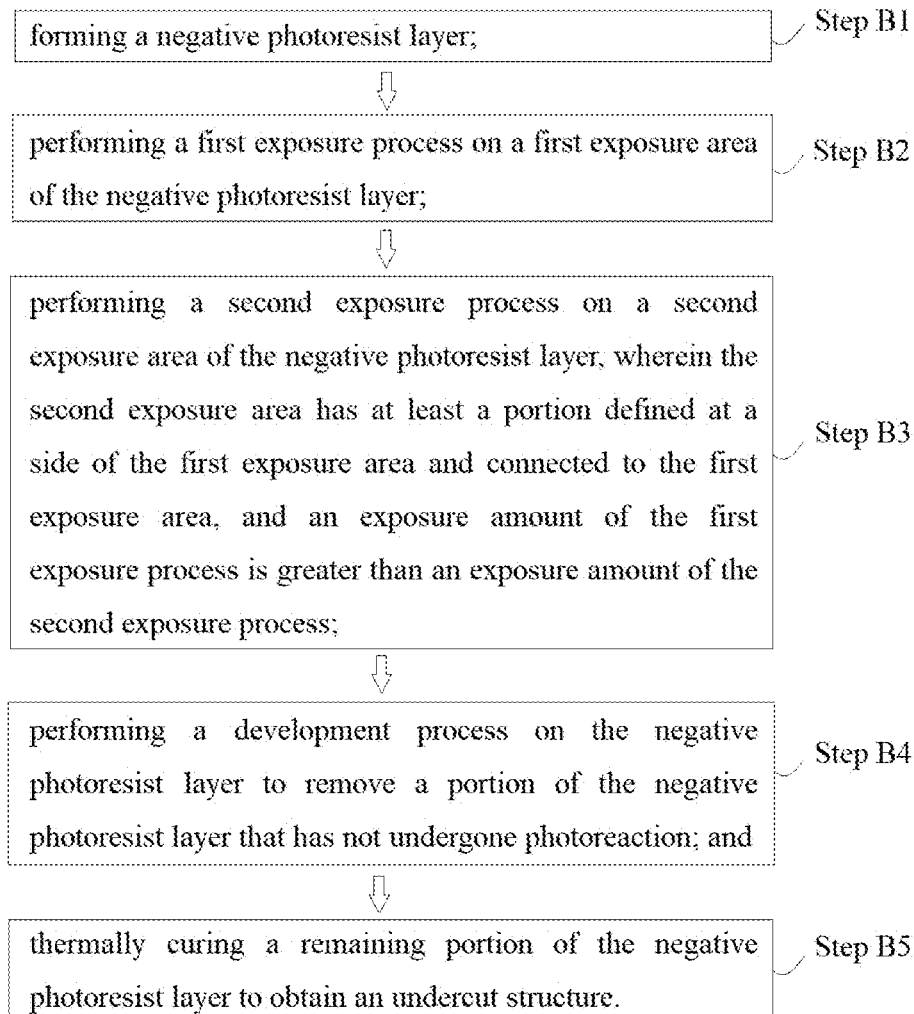
FIG. 1 is a schematic flowchart of a method of processing a photoresist layer provided by an embodiment of the present application.

The technical solutions in the embodiments of the present application will be clearly and completely described in the following with reference to the accompanying drawings in the embodiments. It is apparent that the described embodiments are only a portion of the embodiments of the present application, and not all of them. All other embodiments obtained by a person skilled in the art based on the embodiments of the present application without creative efforts are within the scope of the present application. In addition, it should be understood that the specific implementations described here are only used to illustrate and explain the application, and are not used to limit the application. In the present application, unless otherwise stated, the orientation words used such as "upper" and "lower" generally refer to the upper and lower directions of the device in actual use or working state, and specifically refer to the drawing directions in the drawings, while "inner" and "outer" refer to the outline of the device.

Embodiments of the present application provide a method of processing a photoresist layer, a method of manufacturing a display panel, and a display panel which will be described in detail below. It should be noted that the order of description in the following embodiments is not intended to limit the preferred order of the embodiments.

Figure 2:
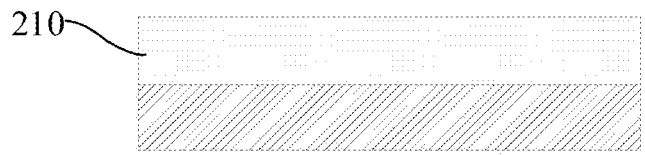
FIG. 2 is a schematic structural diagram of a negative photoresist layer provided by an embodiment of the present application.

Referring to FIG. 1, an embodiment of the present application provides a method of processing a photoresist layer, which includes the following steps:

Step B1, as shown in FIG. 2, forming a negative photoresist layer 210.

Figure 3:
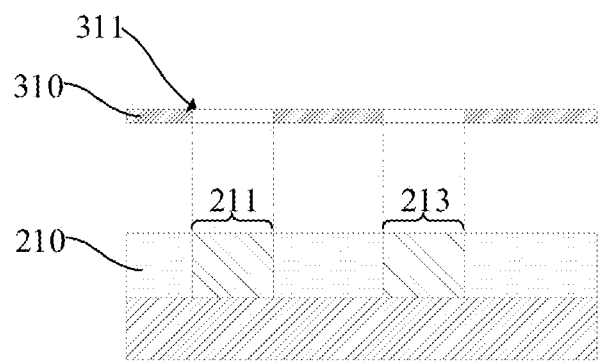
FIG. 3 is a schematic structural diagram of the negative photoresist layer subjected to a first exposure process according to an embodiment of the present application.

Step B2, as shown in FIG. 3, performing a first exposure process on a first exposure area 211 of the negative photoresist layer 210, so that a portion of the negative photoresist layer 210 corresponding to the first exposure area 211 undergoes photoreaction. In this embodiment, a first photomask 310 is used to perform the first exposure process on the first exposure area 211 of the negative photoresist layer 210, and the first photomask 310 is provided with a first opening 311 corresponding to the first exposure area 211.

Figure 4:
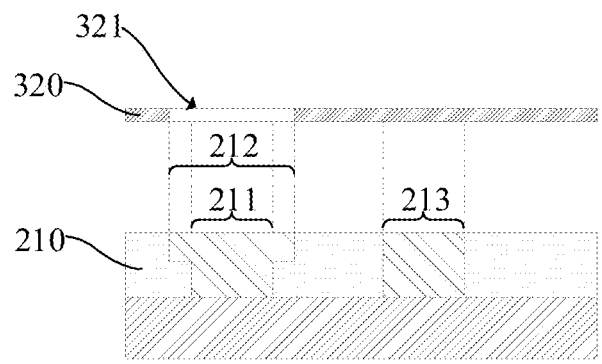
FIG. 4 is a schematic structural diagram 1 of the negative photoresist layer subjected to a second exposure process according to an embodiment of the present application.

Step B3, as shown in FIG. 4, performing a second exposure process on a second exposure area 212 of the negative photoresist layer 210, wherein the second exposure area 212 has at least a portion defined at a side of the first exposure area 211 and connected to the first exposure area 211, and an exposure amount of the first exposure process is greater than an exposure amount of the second exposure process. Therefore, in the second exposure process, a top portion of the negative photoresist layer 210 corresponding to the second exposure area 212 undergoes photoreaction, but a bottom portion of the negative photoresist layer 210 does not undergo photoreaction. In this embodiment, the second photomask 320 is used to perform a second exposure process on the second exposure area 212 of the negative photoresist layer 210, and the second photomask 320 is provided with a second opening 321 corresponding to the second exposure area 212.

Figure 5:
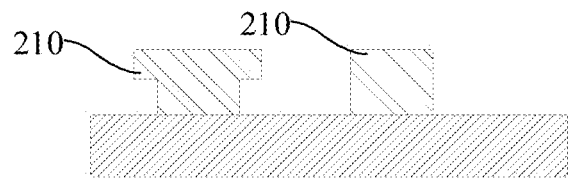
FIG. 5 is a schematic structural diagram 1 of the negative photoresist layer subjected to a development process provided by an embodiment of the present application.

Step B4, as shown in FIG. 5, performing a development process on the negative photoresist layer 210 to remove the negative photoresist layer 210 that has not undergone photoreaction.

Figure 6:
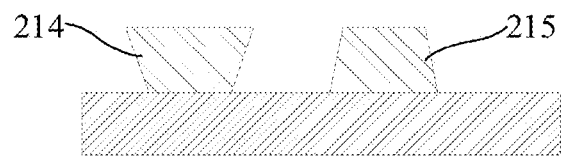
FIG. 6 is a schematic structural diagram 1 of a remaining negative photoresist layer subjected to thermal curing provided by an embodiment of the present application.

Step B5, as shown in FIG. 6, thermally curing the remaining negative photoresist layer 210 to obtain an undercut structure 214.

In an embodiment of the present application, in step B3, as shown in FIG. 4, the first exposure area 211 is set in the second exposure area 212, and an area of the second exposure area 212 is larger than an area of the first exposure area 211, so that portions of the negative photoresist layer 210 corresponding to the first exposure area 211 and the second exposure area 212 undergone the photoreaction form a T-shaped structure; As shown in FIG. 5, in step B4, the negative photoresist layer 210 is developed to remove a portion of the negative photoresist layer 210 that has not undergone photoreaction, and the remaining negative photoresist layer 210 has a T-shaped structure. As shown in FIG. 6, in step B5, the remaining negative photoresist layer 210 is thermally cured, wherein the heating causes the negative photoresist layer 210 to soften to possess certain fluid characteristics, and the T-shaped portion of the negative photoresist layer 210 will be transformed into an inverted trapezoid-like structure, thereby resulting in an undercut structure 214.

Figure 7:
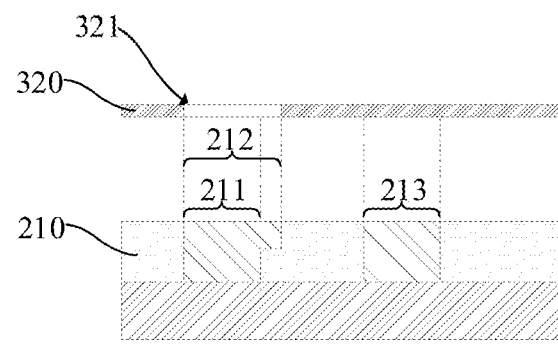
FIG. 7 is a second schematic structural diagram 2 of the negative photoresist layer subjected to the second exposure process according to an embodiment of the present application.
Figure 8:
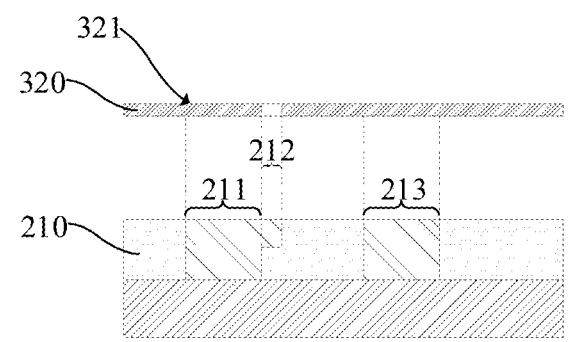
FIG. 8 is a third schematic structural diagram 3 of the negative photoresist layer subjected to the second exposure process according to an embodiment of the present application.

It appreciated that a relationship between the first exposure area 211 and the second exposure area 212 can be appropriately modified according to actual selection and specific requirements, as long as a top portion of the negative photoresist layer 210 that undergoes the photoreaction after the first exposure process can continue to extend a portion outwardly, which is not particularly limited herein. Specifically, in the step B3, as shown in FIG. 7, the first exposure area 211 and the second exposure area 212 may partially overlap; or, as shown in FIG. 8, the second exposure area 212 is defined on a side surface of the first exposure area. 211, and the second exposure area 212 is connected to the first exposure area 211. In the embodiments shown in FIGS. 7 and 8, a top portion of the negative photoresist layer 210 that undergoes the photoreaction after the first exposure process continue to extend a portion outwardly. After performing step B4, the remaining negative photoresist layer 210 includes a portion corresponding to the first exposure area 211 and the second exposure area 212 that undergo photoreaction, and this portion has an L-shape-like structure; finally, the remaining negative photoresist layer 210 is thermally cured, and the heat causes the negative photoresist layer 210 to soften to possess certain fluid characteristics. The L-shaped portion of the negative photoresist layer 210 will be transformed into a parallelogram-like structure, thereby obtaining an undercut structure 214.

In the method of processing the photoresist layer of the embodiment of the present application, the undercut structure 214 can be obtained by performing two exposure processes and one development process on the negative photoresist layer 210, which effectively simplifies the process of manufacturing the undercut structure 214, thereby improving production efficiency.

Optionally, an exposure amount of the first exposure process may be 40 mJ/cm² to 60 mJ/cm², for example, the exposure amount of the first exposure process may be 40 mJ/cm² or 42 mJ/cm², 44 mJ/cm², 46 mJ/cm², 48 mJ/cm², 50 mJ/cm², 52 mJ/cm², 54 mJ/cm², 56 mJ/cm², 58 mJ/cm², or 60 mJ/cm². Of course, the exposure amount of the first exposure process can be adjusted appropriately according to the actual selection and specific needs, which is not particularly limited herein.

Optionally, the exposure amount of the second exposure process may be 10 mJ/cm² to 30 mJ/cm², for example, the exposure amount of the second exposure process may be 10 mJ/cm² or 12 mJ/cm², 14 mJ/cm², mJ/cm², 18 mJ/cm², 20 mJ/cm², 22 mJ/cm², 24 mJ/cm², 26 mJ/cm², 28 mJ/cm² or 30 mJ/cm². Of course, according to the actual selection and specific requirements, the exposure amount of the second exposure process can be adjusted appropriately, which is not particularly limited herein.

Specifically, in the steps B2 and B3, in order to make the exposure amount of the first exposure process greater than the exposure amount of the second exposure process, an exposure time of each of the two exposure processes can be controlled. The exposure amount increases as the exposure time increases. Therefore, in an embodiment of the present application, the exposure time of the first exposure process is greater than the exposure time of the second exposure process.

Figure 9:
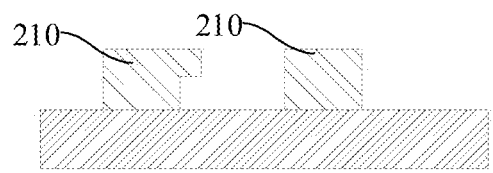
FIG. 9 is a second schematic structural diagram 2 of the remaining negative photoresist layer subjected to thermal curing provided by an embodiment of the present application.
Figure 10:
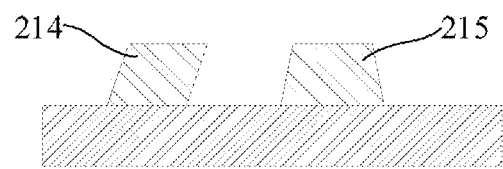
FIG. 10 is a second schematic structural diagram of the remaining negative photoresist layer subjected to thermal curing provided by an embodiment of the present application.

Further, while making the undercut structure 214, a conventional photoresist structure can also be made. Specifically, in the step B2, as shown in FIG. 3, the third exposure area 213 of the negative photoresist layer 210 is also subjected to the first exposure process, so that the third exposure area 213 of the negative photoresist layer 210 has also undergone photoreaction, that is, in step B3, the first exposure area 211 and the third exposure area 213 are subjected to the exposure process at the same time, so that the first exposure area 211 and the third exposure area 213 of the negative photoresist layer 210 both have undergone photoreaction; The first exposure area 211 and the third exposure area 213 are spaced apart from each other, and the second exposure area 212 and the third exposure area 213 are spaced apart from each other; in the step B3, as shown in FIG. 4, FIG. 7, or FIG. 8, a portion of the negative photoresist layer 210 in the third exposure area 213 is not subjected to the exposure process; in the step B4, as shown in FIG. 5 or FIG. 9, the negative photoresist layer 210 is subjected to the development process to remove the portion of the negative photoresist layer 210 that has not undergone photoreaction, and the remaining negative photoresist layer 210 further includes a portion of the third exposure area 213 that has undergone photoreaction; in the step B5, as shown in FIG. 6 or FIG. 10, portions of the negative photoresist layer 210 corresponding to the first exposure area 211 and the second exposure area 212 that have undergone photoreaction form an undercut structure 214, and another portion of the negative photoresist layer 210 corresponding to the third exposure are 213 forms a conventional mesa structure 215. In this embodiment, the second photomask 320 is provided with a first opening 311 corresponding to the first exposure area 211 and the second exposure area 212.

Specifically, as shown in FIG. 6 or FIG. 10, the obtained undercut structure 214 has a negative slope angle, and the obtained mesa structure 215 has a positive slope angle. It should be noted that the undercut structure 214 shown in FIG. 6 only has a negative slope angle, but does not have a positive slope angle; and the undercut structure 214 shown in FIG. 10 has both a negative slope angle and a positive slope angle. In this embodiment, the negative slope angle refers to an acute angle between a side surface and a bottom surface, and the positive slope angle refers to an obtuse angle between the side surface and the bottom surface. As shown in FIG. 6, an included angle between the side surface and the bottom surface of the undercut structure 214 is an acute angle, that is, a negative slope angle; and an included angle between the side surface and the bottom surface of the mesa structure 215 is an obtuse angle, that is, a positive slope angle.

Figure 12:
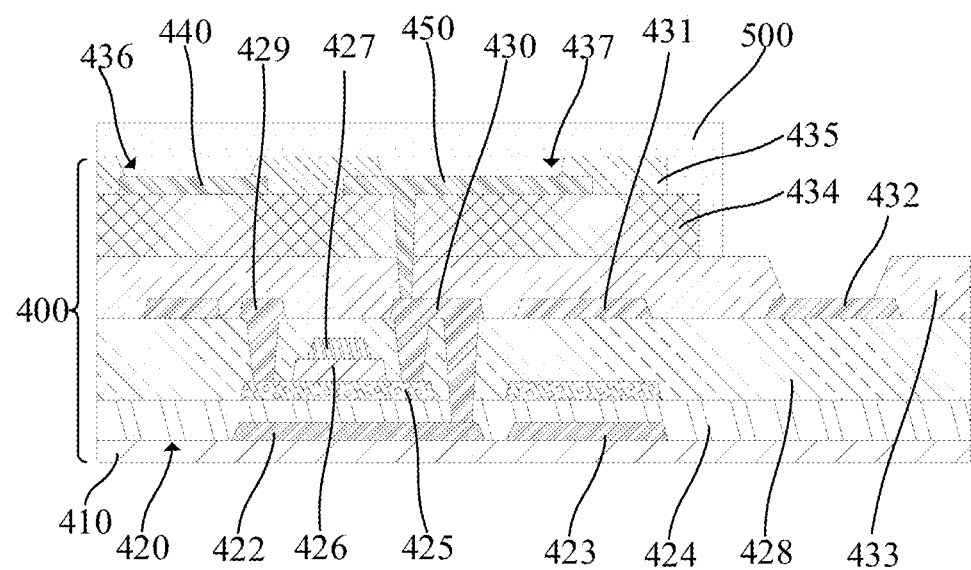
FIG. 12 is a schematic structural diagram of the negative photoresist layer formed on a substrate provided by an embodiment of the present application.
Figure 13:
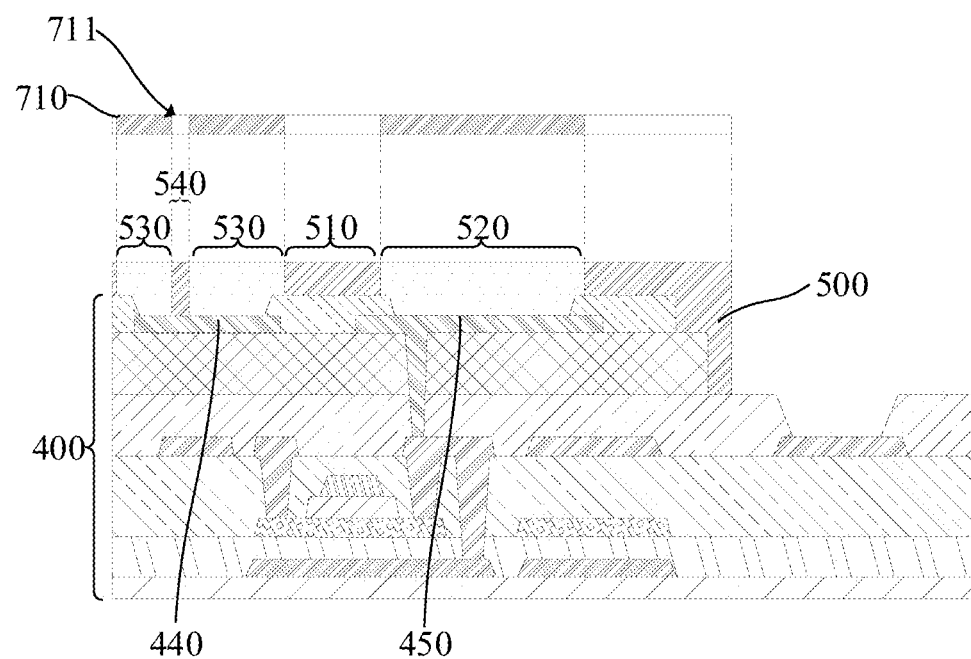
FIG. 13 is a schematic structural diagram of the negative photoresist layer on the substrate subjected to the first exposure process provided by an embodiment of the present application.

Based on the same inventive concept, the method of processing the photoresist can be applied to manufacturing a display panel. As shown in FIG. 11, an embodiment of the present application provides a method of manufacturing a display panel, including the following steps:

Step B10, as shown in FIGS. 12 and 13, forming a first pixel definition layer 500 on substrate 400, wherein the first pixel definition layer 500 is a negative photoresist layer, and the substrate 400 is provided with an auxiliary electrode 440 and a first electrode 450 spaced apart from each other, the first pixel definition layer 500 is defined with a dam area 510, an opening area 520, a via hole area 530, and a first undercut area 540; the dam area 510 encloses the opening area 520; the dam area 50 and the first undercut area 540 enclose the via hole area 530; the via hole area 530 is defined corresponding to the auxiliary electrode 440; and the opening area 520 is defined corresponding to the first electrode 450.

Step B20, as shown in FIG. 13, performing a first exposure process on the dam area 510 and the first undercut area 540 of a first pixel definition layer 500, so that portions of the first pixel definition layer 500 corresponding to the dam area 510 and the first undercut area 540 undergo photoreaction. In this embodiment, a third photomask 710 is used to perform the first exposure process on the first undercut area 540 and the dam area 510 of the first pixel definition layer 500, and the third photomask 710 is provided with a third opening 711 corresponding to the first undercut area 540 and the dam area 510.

Figure 14:
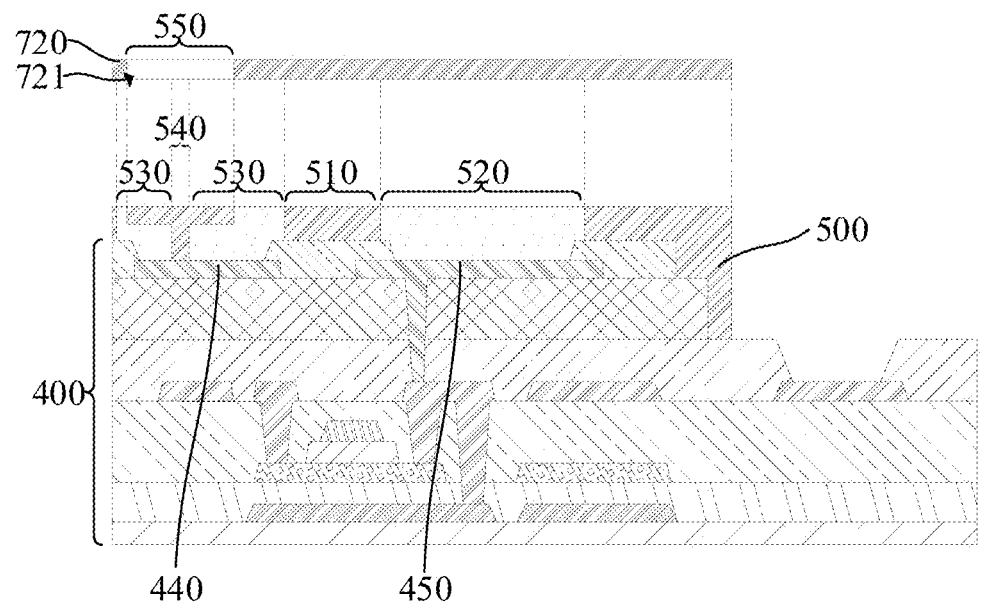
FIG. 14 is a schematic structural diagram 1 of the negative photoresist layer on a substrate subjected to the second exposure process provided by an embodiment of the present application.

Step B30, as shown in FIG. 14, performing a second exposure process on a second undercut area 550 of the first pixel definition layer 500, wherein one side of the second undercut area 550 extends to the first undercut area 540, another side of the second undercut area 550 is connected to the via hole area 530, and an exposure amount of the first exposure process is greater than an exposure amount of the second exposure process. Therefore, in the second exposure process, a top portion of the first pixel definition layer 500 corresponding to the second undercut area 550 undergoes photoreaction, but a bottom portion of the first pixel definition layer 500 does not undergo photoreaction. In this embodiment, a fourth photomask 720 is used to perform a second exposure process on the second undercut area 550 of the first pixel definition layer 500, and the fourth photomask 720 is provided with a fourth opening 721 corresponding to the second undercut area 550.

Figure 15:
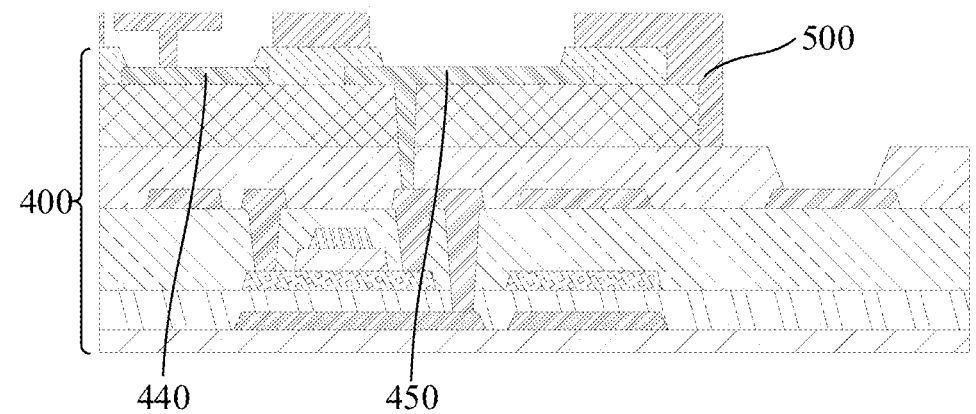
FIG. 15 is a schematic structural diagram 1 of the negative photoresist layer on a substrate subjected to the development process provided by an embodiment of the present application.

Step B40, as shown in FIG. 15, performing a development process on the first pixel definition layer 500 to remove the first pixel definition layer 500 in the opening area 520 and the via hole area 530, to form a pixel opening 580 exposing the first electrode 450 and a connection via hole 590 exposing the auxiliary electrode 440.

Figure 16:
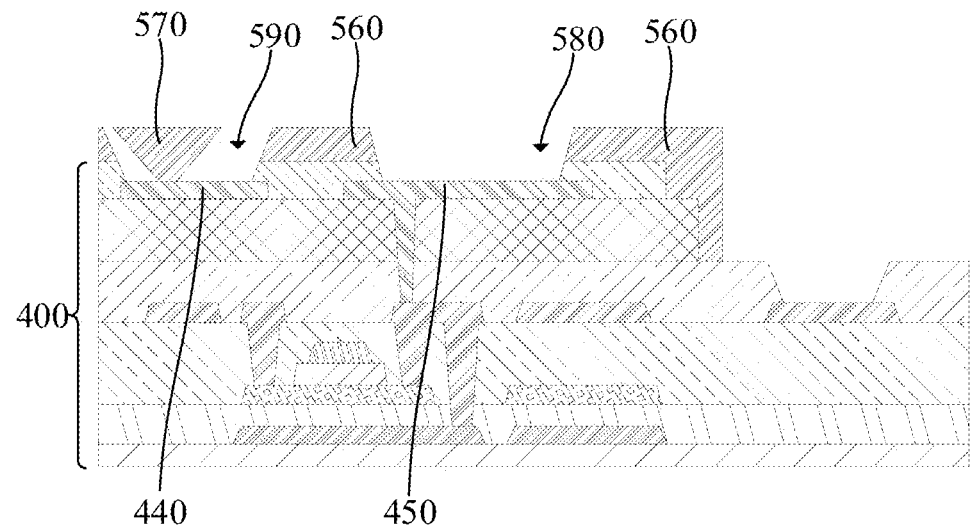
FIG. 16 is a schematic structural diagram 1 of the negative photoresist layer on a substrate subjected to thermal curing provided by an embodiment of the present application.

Step B50, as shown in FIG. 16, thermally curing a remaining portion of the first pixel definition layer 500, wherein the first pixel definition layer 500 corresponding to the first undercut area 540 and the second undercut area 50 forms an undercut structure 570, the first pixel definition layer 500 corresponding to the dam area 510 forms a dam 560, the dam 560 is enclosed to form the pixel opening 580 for exposing the first electrode 450, and the dam 560 and the undercut structure 570 are enclosed to form the connection via hole 590 for exposing the auxiliary electrode 440.

Figure 17:
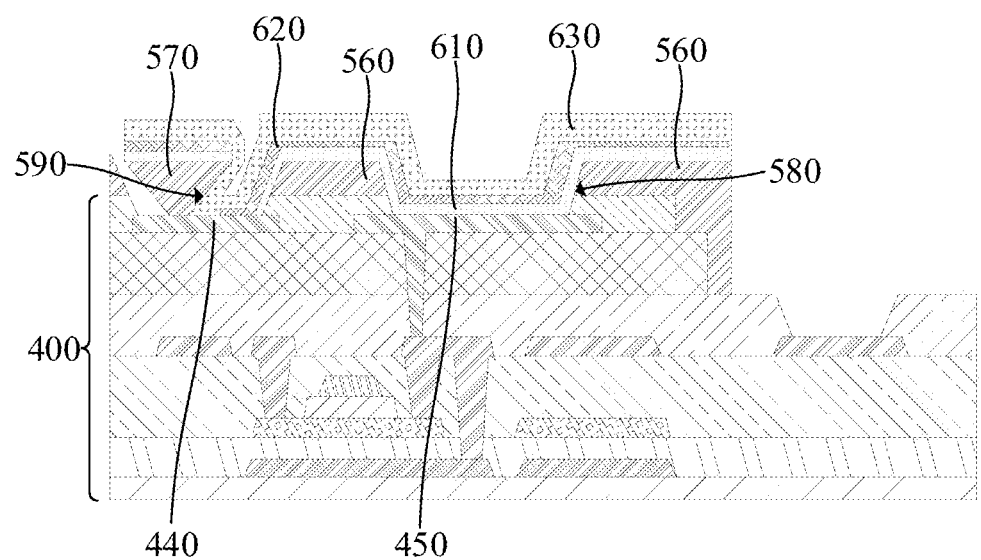
FIG. 17 is a schematic structural diagram 1 of a light-emitting layer, a second electrode, and an encapsulation layer formed on a dam and an undercut structure according to an embodiment of the present application.

Step B60, as shown in FIG. 17, forming a light-emitting layer 610 on the first electrode 450.

Step B70, as shown in FIG. 17, forming a second electrode 620 on the light-emitting layer 610, wherein the second electrode 6250 extends into the connection via hole 590 and is connected to the auxiliary electrode 440.

Optionally, in the step B20, as shown in FIG. 14, a through hole area is annular, and the through hole area is provided at an outer peripheral side of the first undercut area 540 and the second undercut area 550. Of course, according to actual choices and specific requirements, one side of the first undercut area 540 can be connected to the dam area 510, and another side of the first undercut area 540 is connected to one side of the through hole area through the second undercut area 550, and another side of the through hole area is connected to the dam area 510.

In the step B30, as shown in FIG. 14, the first undercut area 540 is defined in the second undercut area 550, and an area of the second undercut area 550 is larger than an area of the second undercut area 550, so that portions of the first pixel definition layer 500 corresponding to the first undercut area 540 and the second undercut area 550 that have undergone photoreaction form a T-shaped structure; in the step B40, as shown in FIG. 15, the first pixel definition layer 500 is subjected to the development process to remove the first pixel definition layer 500 that has not undergone photoreaction, and the portions of the first undercut area 540 and the second undercut area 550 that have undergone photoreaction have a T-shaped structure. In the step B50, as shown in FIG. 16, the remaining first pixel definition layer 500 is thermally cured, and the heat causes the first pixel definition layer 500 to soften to possess certain fluid characteristics, and the T-shaped portion of the first pixel definition layer 500 is transformed into a structure similar to an inverted trapezoid, thereby obtaining an undercut structure 570. In this embodiment, the through hole area is annular, and the through hole area is provided at the outer peripheral side of the first undercut area 540 and the second undercut area 550.

Figure 18:
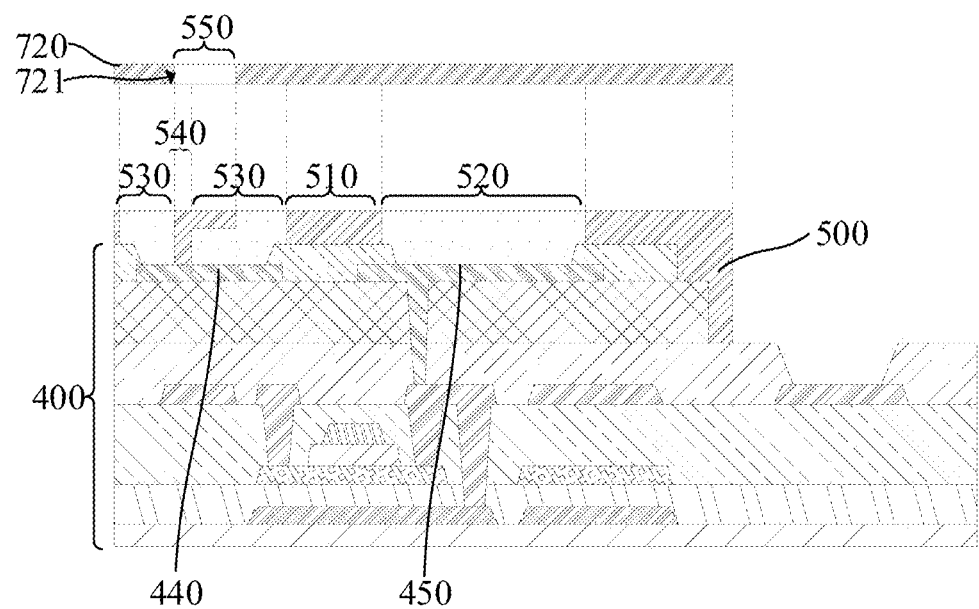
FIG. 18 is a second schematic structural diagram 2 of the negative photoresist layer on a substrate subjected to the second exposure process according to an embodiment of the present application.
Figure 19:
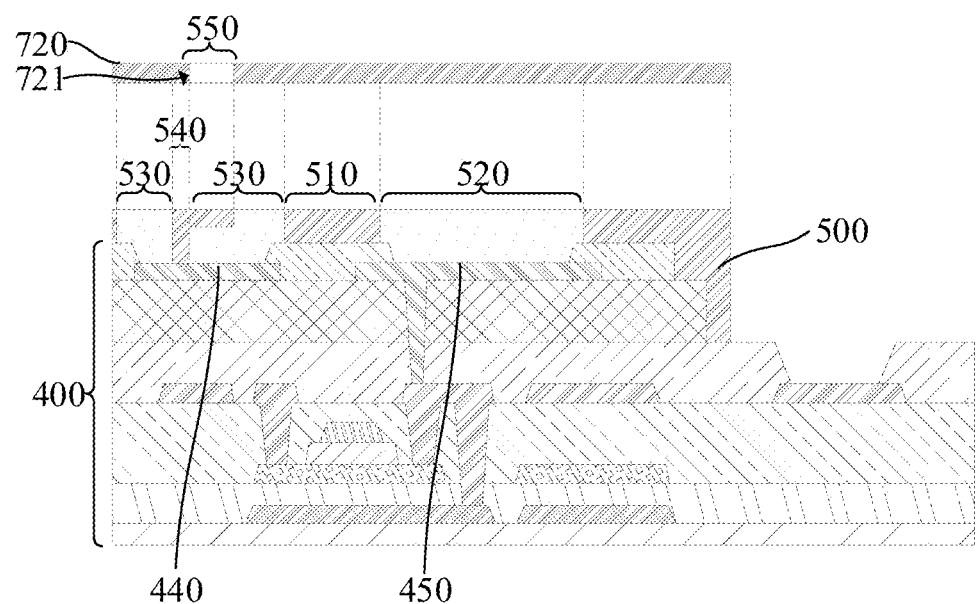
FIG. 19 is a third schematic structural diagram 3 of the negative photoresist layer on a substrate subjected to the second exposure process provided by an embodiment of the present application.
Figure 20:
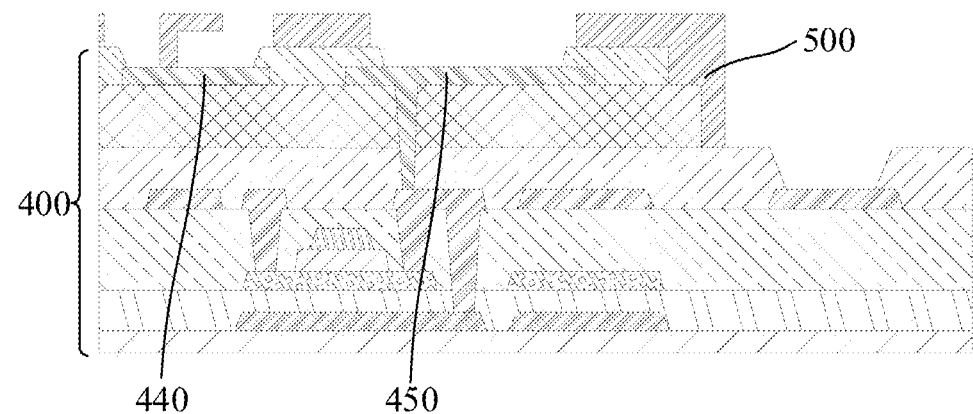
FIG. 20 is a second schematic structural diagram 2 of the negative photoresist layer on a substrate subjected to the development process provided by an embodiment of the present application.
Figure 21:
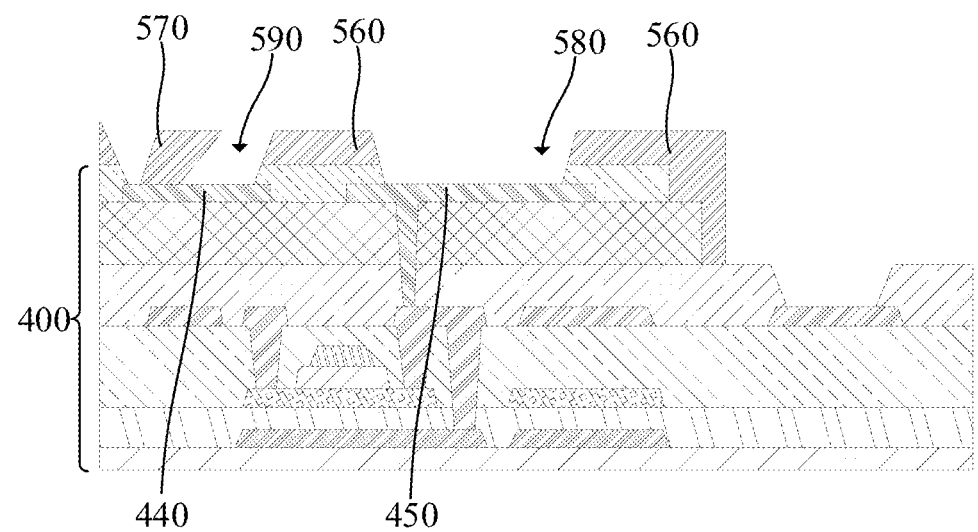
FIG. 21 is a second schematic structural diagram 2 of the negative photoresist layer on a substrate subjected to thermal curing according to an embodiment of the present application.
Figure 22:
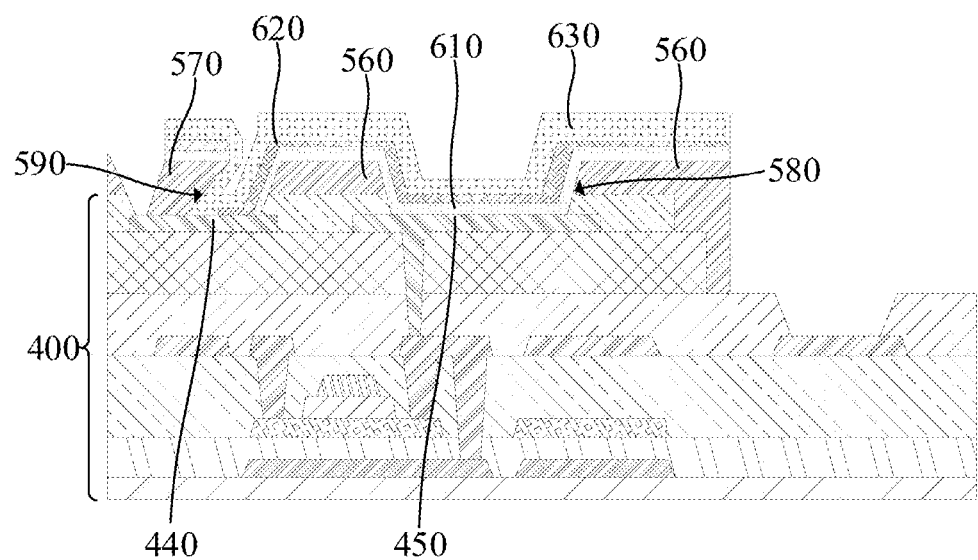
FIG. 22 is a second structural diagram 2 of the light-emitting layer, the second electrode, and the encapsulation layer formed on the dam and the undercut structure provided by an embodiment of the present application.

It appreciated that a relationship between the first undercut area 540 and the second undercut area 550 can be appropriately modified according to actual selection and specific requirements, as long as a top of the negative photoresist layer 210 undergoing the photoreaction after the first exposure process can continue to extend a portion outward, which is not particularly limited herein. Specifically, in the step B20 and step B30, as shown in FIG. 18, the first undercut area 540 and the second undercut area 550 may partially overlap. Alternatively, as shown in FIG. 19, the second undercut area 550 is defined on a side surface of the first undercut area 540, and the second undercut area 550 is connected to the first undercut area 540. In both the embodiments shown in FIGS. 18 and 19, a top of the negative photoresist layer 210 undergoing the photoreaction after the first exposure process can continue to extend a portion outward; and in the step B40, as shown in FIG. 20, the first pixel definition layer 500 is subjected to the development process to remove the first pixel definition layer 500 that has not undergone photoreaction. The remaining first pixel definition layer 500 includes portions corresponding to the first undercut area 540 and the second undercut area 550, and this portion has an L shaped-like structure. In the step B50, as shown in FIG. 21, the remaining first pixel definition layer 500 is thermally cured, and the heating causes the first pixel definition layer 500 to soften to possess certain fluid characteristics, and L-shaped portion of the first pixel definition layer 500 will be transformed into a parallelogram-like structure, thereby obtaining the undercut structure 570 and the dam 560; and in the step B60 and step B70, as shown in FIG. 22, a light-emitting layer 610 is formed on the first electrode 450, a second electrode 620 is formed on the light-emitting layer 610, and the second electrode 620 extends into the connection via hole 590 and is connected to the auxiliary electrode 440.

In the method of manufacturing the display panel of an embodiment of the present application, the undercut structure 570 can be manufactured by performing two exposure processes and one development process on the first pixel definition layer 500, which effectively simplifies the process of manufacturing the undercut structure 570, thereby improving production efficiency.

Optionally, in the step B20, the exposure amount of the first exposure process may be 40 mJ/cm$^2$ to 60 mJ/cm$^2$, for example, the exposure amount of the first exposure process may be 40 mJ/cm², 42 mJ/cm², 44 mJ/cm², 46 mJ/cm², 48 mJ/cm², 50 mJ/cm², 52 mJ/cm², 54 mJ/cm², 56 mJ/cm², 58 mJ/cm², or 60 mJ/cm². Of course, the exposure amount in the first exposure process can be adjusted appropriately according to the actual selection and specific needs, which is not particularly limited herein.

Optionally, in the step B30, the exposure amount of the second exposure process may be 10 mJ/cm² to 30 mJ/cm², for example, the exposure amount of the second exposure process may be 10 mJ/cm², 12 mJ/cm², 14 mJ/cm², 16 mJ/cm², 18 mJ/cm², 20 mJ/cm², 22 mJ/cm², 24 mJ/cm², 26 mJ/cm², 28 mJ/cm², or 30 mJ/cm². Of course, according to the actual selection and specific requirements, the exposure amount of the second exposure process can be adjusted appropriately, which is not particularly limited herein.

Optionally, in the step B30, the exposure amount of the second exposure process may be 10 mJ/cm² to 30 mJ/cm², for example, the exposure amount of the second exposure process may be 10 mJ/cm², 12 mJ/cm², 14 mJ/cm², 16 mJ/cm², 18 mJ/cm², 20 mJ/cm², 22 mJ/cm², 24 mJ/cm², 26 mJ/cm², 28 mJ/cm², or 30 mJ/cm². Of course, according to the actual selection and specific requirements, the exposure amount of the second exposure process can be adjusted appropriately, which is not particularly limited herein.

Specifically, as shown in FIG. 16 or FIG. 21, the obtained undercut structure 570 has a negative slope angle, and the obtained mesa structure has a positive slope angle. It should be noted that the undercut structure 570 shown in FIG. 16 only has a negative slope angle, but does not have a positive slope angle; the undercut structure 570 shown in FIG. 21 has both a negative slope angle and a positive slope angle. In this embodiment, the negative slope angle refers to an acute angle between a side surface and a bottom surface, and the positive slope angle refers to an obtuse angle between the side surface and the bottom surface. As shown in FIG. 6, an included angle between the side surface and the bottom surface of the undercut structure 570 is an acute angle, that is, a negative slope angle; an included angle between the side surface and the bottom surface of the dam 560 is an obtuse angle, that is, a positive slope angle.

Specifically, as shown in FIG. 12, the substrate 400 further includes a base substrate 410 and a driving circuit layer 420 disposed on the base substrate 410. The auxiliary electrode 440 and the first electrode 450 are disposed on the driving circuit layer 420, and the first electrode 450 is electrically connected to the driving circuit layer 420. The driving circuit layer 420 includes a base substrate 410, a light-shielding electrode 422, a first storage electrode 423, a buffer layer 424, an active layer 425, a gate insulating layer 426, a gate 427, a first interlayer insulating layer 428, a source electrode 429, a drain 430, a second storage electrode 431, a bonding electrode 432, a planarization layer 433, and the second interlayer insulating layer 434. The light shielding electrode 422 and the first storage electrode 423 are spaced apart from each other on the base substrate 410, and the buffer layer 424 covers the base substrate 410, the light-shielding electrode 422, and the first storage electrode 423; The active layer 425 is disposed on the buffer layer 424 and above the light-shielding electrode 422, the gate insulating layer 426 is disposed on the active layer 425, the gate 427 is disposed on the gate insulating layer 426; the first interlayer insulating layer 428 covers the buffer layer 424, the active layer 425, and the gate 427; the source electrode 429, the drain electrode 430, the second storage electrode 431, and the bonding electrode 432 are arranged on the first interlayer insulating layer 428 at intervals, the source electrode 429 is in contact with one end of the active layer 425, the drain electrode 430 is in contact with another end of the active layer 425, and the drain electrode 430 is also in contact with the light-shielding electrode 422; the second storage electrode 431 is correspondingly disposed above the first storage electrode 423, and the first storage electrode 423 and the second storage electrode 431 form a storage capacitor; the planarization layer 433 is disposed on the first interlayer insulating layer 428, and the planarization layer 433 is exposed and bonding electrode 432; the second interlayer insulating layer 434 covers the planarization layer 433, the source electrode 429, the drain electrode 430, and the second storage electrode 431, the auxiliary electrode 440 and the first electrode 450 are provided on the second interlayer insulating layer 434.

Specifically, as shown in FIG. 12, the substrate 400 further includes a second pixel definition layer 435 disposed on the auxiliary electrode 440 and the first electrode 450, the first pixel definition layer 500 is disposed on the second pixel definition layer 435, and the second pixel definition layer 435 is disposed on the second pixel definition layer 435. The pixel definition layer 435 is provided with a first through hole 436 for exposing the auxiliary electrode 440 and a second through hole 437 for exposing the first electrode 450. In this embodiment, the second pixel definition layer 435 is disposed on the second interlayer insulating layer 434.

Specifically, the method of manufacturing the display panel further includes: step 80, forming an encapsulation layer 630 on the second electrode 620. The encapsulation layer 630 covers the dam 560 and the undercut structure 570. The encapsulation layer 630 can protect the second electrode 620.

Referring to FIG. 17 and FIG. 22 in conjunction with FIG. 12, an embodiment of the present application further provides a display panel, which is manufactured by using the above-mentioned method of manufacturing the display panel. The display panel includes:
  a base substrate 410;
  a driving circuit layer 420 disposed on the base substrate 410;
  an auxiliary electrode 440 disposed on the driving circuit layer 420;
  a first electrode disposed 450 on the driving circuit layer 420 and spaced apart from the auxiliary electrode 440;
  a dam 560 disposed on the driving circuit layer 420, wherein the dam 560 is made of a negative photoresist, the dam 560 has a positive slope angle, the dam 560 is enclosed to form a pixel opening 580, and the pixel opening 580 exposes the first electrode 450;
  an undercut structure 570 disposed on the drive circuit layer 420, wherein the undercut structure 570 is made of a negative photoresist 570, the undercut structure 570 has a negative slope angle, the undercut structure 570 and the dam 560 are enclosed to form a connection via hole 590, the connection via hole 590 exposes the auxiliary electrode 440;
  a light-emitting layer 610 disposed on the first electrode 450; and
  a second electrode 620 disposed on the light-emitting layer 610, wherein the second electrode 620 extends into the connection via hole 590 and is connected to the auxiliary electrode 440.

The method of processing a photoresist layer, the method of manufacturing a display panel, and the display panel provided by the embodiments of the present application are described in detail above. Specific examples are used to explain the principle and implementation of the present application. The descriptions of the above embodiments are only used to help understand the present application. Also, for those skilled in the art, according to the ideas of the present application, there will be changes in the specific implementation and application scope. In summary, the content of this specification should not be construed as limiting the present application.

What is claimed is:

1. A method of manufacturing a display panel, comprising:
- Step B10, forming a first pixel definition layer on a substrate, wherein the first pixel definition layer is a negative photoresist layer, the substrate is provided with an auxiliary electrode and a first electrode spaced apart from each other; the first pixel definition layer is defined with a dam area, an opening area, a via hole area, and a first undercut area; the dam area encloses the opening area; the dam area and the first undercut area enclose the via hole area; the via hole area is defined corresponding to the auxiliary electrode; and the opening area is defined corresponding to the first electrode;
- Step B20, performing a first exposure process on the dam area and the first undercut area of a first pixel definition layer to enable an entire portion of the first pixel definition layer corresponding to the first undercut area to undergo photoreaction;
- Step B30, performing a second exposure process on a second undercut area of the first pixel definition layer, such that a top portion of the first pixel definition layer corresponding to the second undercut area undergoes photoreaction, but a bottom portion of the first pixel definition layer corresponding to the second undercut area does not undergo photoreaction, wherein one side of the second undercut area extends to the first undercut area, another side of the second undercut area is connected to the via hole area, and an exposure amount of the first exposure process is greater than an exposure amount of the second exposure process, wherein the first undercut area is defined in the second undercut area, and an area of the second undercut area is larger than an area of the first undercut area;
- Step B40, performing a development process on the first pixel definition layer to remove the first pixel definition layer in the opening area and the via hole area, after the step B20 and the step B30, to form a pixel opening exposing the first electrode and a connection via hole exposing the auxiliary electrode;
- Step B50, thermally curing a remaining portion of the first pixel definition layer, wherein the first pixel definition layer corresponding to the first undercut area and the second undercut area forms an undercut structure, the first pixel definition layer corresponding to the dam area forms a dam, the dam is enclosed to form the pixel opening for exposing the first electrode, and the dam and the undercut structure are enclosed to form the connection via hole for exposing the auxiliary electrode;
- Step B60, forming a light-emitting layer on the first electrode; and
- Step B70: forming a second electrode on the light-emitting layer, wherein the second electrode extends into the connection via hole and is connected to the auxiliary electrode.

2. The method of manufacturing the display panel according to claim 1, wherein the first undercut area and the second undercut area partially overlap.

3. The method of manufacturing the display panel according to claim 1, wherein the second undercut area is defined at one side of the first undercut area, and the second undercut area is connected to the first undercut area.

4. The method of manufacturing the display panel according to claim 1, wherein an exposure time of the first exposure process is greater than an exposure time of the second exposure process.

5. The method of manufacturing a display panel according to claim 1, wherein the substrate further comprises a base substrate and a driving circuit layer disposed on the base substrate, the auxiliary electrode and the first electrode are disposed on the driving circuit layer, and the first electrode is electrically connected to the driving circuit layer.

6. The method of manufacturing the display panel according to claim 5, wherein the substrate further comprises a second pixel definition layer disposed on the auxiliary electrode and the first electrode, the first pixel definition layer is disposed on the second pixel defining layer, and the second pixel definition layer is defined with a first through hole for exposing the auxiliary electrode and a second through hole for exposing the first electrode.

7. The method of manufacturing a display panel according to claim 1, wherein the substrate further comprises a base substrate and a driving circuit layer disposed on the base substrate, the auxiliary electrode and the first electrode are disposed on the driving circuit layer, and the first electrode is electrically connected to the driving circuit layer.

8. The method of manufacturing the display panel according to claim 1, wherein the method of manufacturing the display panel further comprises:
- Step 80, forming an encapsulation layer on the second electrode and covering the dam and the undercut structure.

9. The method of manufacturing the display panel according to claim 1, wherein the exposure amount of the first exposure process ranges from 40 mJ/cm$^2$ to 60 mJ/cm$^2$.

10. The method of manufacturing the display panel according to claim 1, wherein the exposure amount of the second exposure process ranges from 10 mJ/cm$^2$ to 30 mJ/cm$^2$.